United States Patent
Maassen et al.

(10) Patent No.: US 6,794,861 B2
(45) Date of Patent: Sep. 21, 2004

(54) METHOD AND APPARATUS FOR SOCKET CALIBRATION OF INTEGRATED CIRCUIT TESTERS

(75) Inventors: Howard M. Maassen, San Jose, CA (US); William A. Fritzsche, Morgan Hill, CA (US)

(73) Assignee: NPTest, LLC, San Jose, CA (US)

( * ) Notice: Subject to any disclaimer, the term of this patent is extended or adjusted under 35 U.S.C. 154(b) by 79 days.

(21) Appl. No.: 10/106,280

(22) Filed: Mar. 25, 2002

(65) Prior Publication Data

US 2002/0135357 A1 Sep. 26, 2002

Related U.S. Application Data (60) Provisional application No. 60/279,081, filed on Mar. 26, 2001.

(51) Int. Cl.[7] .............................................. G01R 27/02
(52) U.S. Cl. ................................................... 324/158.1
(58) Field of Search ............................. 324/158.1, 523, 324/527, 528, 602, 606, 667, 604, 681, 710, 74, 755, 763, 754, 765; 702/79, 89, 106, 118, 120, 125; 714/700, 731; 327/72

(56) References Cited

U.S. PATENT DOCUMENTS

| | | | | |
|---|---|---|---|---|
| 5,539,305 A | | 7/1996 | Botka | ....................... 324/158.1 |
| 5,703,489 A | | 12/1997 | Kuroe | ........................... 324/601 |
| 5,923,726 A | * | 7/1999 | Regimand | ..................... 378/207 |
| 6,324,485 B1 | * | 11/2001 | Ellis | ............................. 702/117 |
| 6,492,797 B1 | * | 12/2002 | Maassen et al. | ............... 324/74 |
| 6,570,397 B2 | * | 5/2003 | Mayder et al. | .............. 324/754 |

FOREIGN PATENT DOCUMENTS

| | | | |
|---|---|---|---|
| DE | 199 15 398 A1 | 10/1999 | |
| DE | 199 22901 A1 | 12/1999 | ........... G01R/35/00 |
| EP | 0919823 A2 | 6/1999 | |

* cited by examiner

*Primary Examiner*—Ernest Karlsen
*Assistant Examiner*—Trung Q. Nguyen (57) ABSTRACT

Method and apparatus for calibrating timing accuracy during testing of integrated circuits. An ATE type (automatic test equipment) integrated circuit tester calibrates itself to reference blocks (dummy ICs) that have the same relevant dimensions as the integrated circuits to be tested and have fit into the test fixture. The number of reference blocks required is equal to the number of signal terminals on the integrated circuit to be tested subject to timing calibration where typically the number of signal terminals is less than the total number of signal terminals on the IC being tested and is typically a relatively small number, e.g., 9. This is useful in the case of high pin count integrated circuits where the pins are grouped into relatively small numbers of pins which are source synchronous. A signal trace electrically connects a different signal terminal to a common reference terminal on each reference block in the set. The reference blocks are then cycled through the tester apparatus as if they were an IC under test, resulting in timing calibration. This allows calibration for critical timing skew requirements for small groups of input/output pins on the IC under test.

20 Claims, 7 Drawing Sheets

METHOD AND APPARATUS FOR SOCKET CALIBRATION OF INTEGRATED CIRCUIT TESTERS

CROSS-REFERENCE TO RELATED APPLICATION

This application claims priority to U.S. Provisional Application No. 60/279,081, filed Mar. 26, 2001.

FIELD OF THE INVENTION

This invention relates to integrated circuits and more specifically to testing of integrated circuits, and especially to timing calibration of integrated circuit testing apparatus.

DESCRIPTION OF THE RELATED ART

High speed digital buses for fast memories, processors and various chip sets, all of which are integrated circuits, often have critical timing skew requirements for signals at their input and output terminals ("pins"). Such integrated circuits typically have input/output data rates of, e.g., one Gigabit per second and higher. This has led to much tighter test accuracy requirements than previously known. All possible calibration (timing) errors must be addressed in order to obtain tester apparatus timing accuracy to the level required to measure the set-up, hold and propagation delay times required by these high data rate devices. Typical calibration requirements are 50 picosecond to 100 picosecond timing accuracy.

It is well known that various factors impede such accuracy. These include trace (conductor) lengths on the device interface board. The device interface board is part of the assembly which interfaces between the actual integrated circuits being tested and the electronic portions of the test apparatus (e.g., ATE—automatic test equipment). Examples of the pertinent types of test apparatus (testers) are ITS9000KX, RDX2200, and RDX2400, all supplied by Schlumberger Technologies, Inc. On these device interface boards the trace links may change slightly during the fabrication process or if cables are used instead of traces, the cables may not match the design length due to fabrication tolerances. Additionally, dielectric constants of the insulation material used in the printed circuit board, which is the material of the device interface board, or in the cables, may vary. Additionally, the dielectrics have a loss factor which is not predictable and typically differs in response to changes in frequencies of the signals being propagated. A number of other fabrication factors also come into play, such as AC impedance changes due to the traces or cables, solder vias creating impedance discontinuities, electrical interconnections pads providing impedance discontinuities, and cable terminations affecting impedances.

Resulting technical problems are frequency dependent alternating current (AC) loss, reflections in variations and propagation delay, all of which complicate calibration of the device interface board and hence tend to reduce test accuracy.

Attempts to measure these timing errors traditionally include manual oscilloscope measurements to perform a check of accuracy and skew in timing. Automated probe measurements are an automated version of the manual oscilloscope approach. Also, TDR (time domain reflection) is a technique for measuring propagation delays in a transmission line. This is accomplished in the context of device interface boards by transmitting a signal down a transmission line with a source terminated driver and observing the actual voltage level at the transmission line in the transmission line side of the driver source impedance. This is possible due to the discontinuity at the device under test (DUT) due to the integrated circuit socket which is in the signal path from the tester apparatus through the device interface board. There are also other discontinuities present which affect the accuracy.

See also copending and commonly owned U.S. patent application Ser. No. 09/514,708, entitled "Method And Apparatus For Socket Calibration" commonly invented and incorporated herein by reference in its entirety, filed Feb. 28, 2000, which describes calibration for testing using a set of reference blocks that serve to switch a common probe tester channel to individual channels in succession in the pins of the integrated circuit device under test. That application is incorporated herein by reference in its entirety. Each reference block is effectively a "dummy" integrated circuit which contains traces shorted between certain of its pins (terminals). As each reference block is inserted into the device under test socket in the tester apparatus, that reference block switches the signal path to a new pin. Each reference block trace is short and all blocks in the set have identical trace lengths. The reference blocks are typically fabricated to have the same external features and dimensions as the actual integrated circuit DUT so they may be cycled through the tester apparatus socket using the conventional automated device handler.

The number of reference blocks required is equal to the number of DUT socket signal terminals being subject to timing calibration for a particular device under test. Each trace connects a different signal terminal to a common reference terminal on each reference block in the set. To perform the timing calibration, the reference blocks may be mounted on a single fixture one at a time using multi-site fixtures, or multiple reference blocks may be used in parallel. The fixture provides electrical connection of the reference block to the conventional load board of the tester apparatus and ultimately the electronic portions of the tester apparatus.

The tester apparatus then programs a signal pulse on the signal terminal of the reference block, and measures the amount of time that elapses until the resulting pulse occurs on the reference terminal of the reference block. Polarity is then reversed using the programmable I/O feature of the tester apparatus and the tester apparatus programs a signal pulse on the reference terminal of the reference block. (That is, the direction of signal flow is reversed.) The tester apparatus then measures the amount of time that elapses until the resulting signal pulse occurs on the signal terminal of the reference block. These relative timing offset values are saved in the tester apparatus memory. These steps are repeated for each reference block in the set. The highest relative offset timing values obtained are used to calibrate the tester timing for both programming a signal pulse on the signal terminals (known as "driving") and measuring a signal pulse on the signal terminals (known as "comparing"). A final calibration step is performed to equalize the difference between the difference between the relative timing offset for programming a signal pulse on the reference terminal and for measuring a signal pulse on the reference terminal. The final calibration step can be performed in several different ways.

SUMMARY

The above described reference block method and apparatus are extended here. For high speed integrated circuits there are situations where the number of reference blocks for tester calibration may be less than the total number of pins (signal terminals) on the IC device under test. This is typically the case where there are groups of pins on the device under test with commonality in terms of timing, so that the number of reference blocks in the set may be limited to only the number of pins in each group. The same set of blocks is then used to calibrate each group of pins on the DUT. One example of this situation is the well known source synchronous bus where there may be many pins on the device under test but for timing purposes they are subdivided into multiple groups of, for instance, 8 pins each, each group with a single associated clock signal. In this case the entire device under test may be subject to calibration using a single set of reference blocks having a number no greater than the number of pins in each group. Hence while the entire device under test may have, for instance, 720 input/output pins. If they are subdivided into 80 groups of 9 pins each, then a set of 9 reference blocks may be sufficient for calibration of the tester apparatus. In other words the reference block technique is useful for large pin count devices that are known by the person doing the testing to have smaller input/output bus groups with tight internal calibration requirements. The above example is a source synchronous bus. Other examples include a source synchronous low voltage differential signaling differential bus. In the case of the low voltage differential signal bus it has been found advantageous to use differential jumper traces on the reference blocks. That is, two jumper traces are provided on each reference block.

Also, another differential type calibration measures timing skew between a true and bar (high and low) output signal from the device under test for a differential (two signal) bus. In this case a set of only two reference blocks is used for the true and bar signal channels.

Also it has been found that various improvements to the reference block to optimize their construction, as disclosed herein.

DETAILED DESCRIPTION

Figure 1:
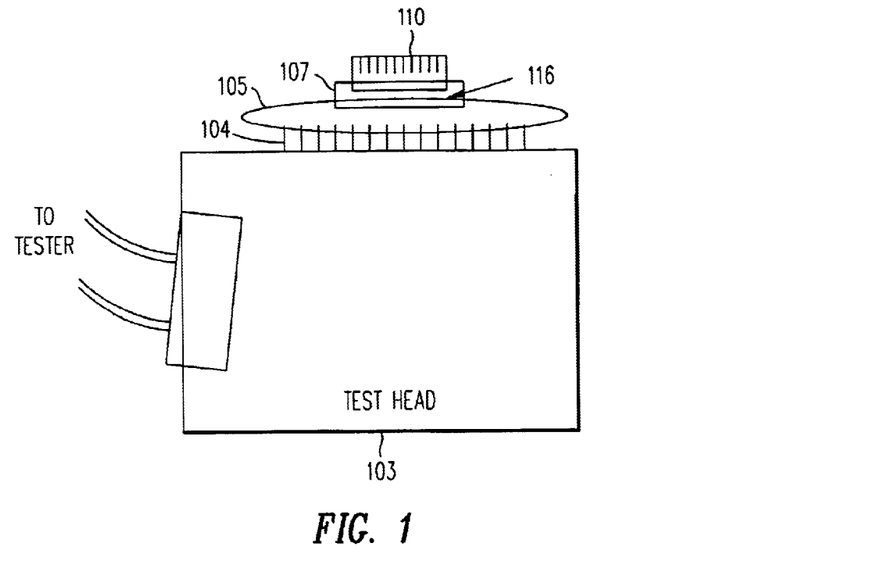
FIG. 1 shows an arrangement according to the present invention.

FIG. 1 is a diagram showing a tester apparatus of mostly conventional components used with the present invention. The reference block 110 is inserted into a fixture (CUT socket) 107. The reference block is essentially a surrogate for the integrated circuit to be tested (DUT) by the tester and has electrical connections to make electrical contact with loadboard 105 through fixture 107 in the same physical locations as would the actual DUT. Loadboard 105 physically spreads out the electrical signals coming from the reference block 110 and is in turn electrically connected to a test head 103 which electrically interfaces with the conventional ATE tester (not shown). An exemplary ATE tester is the RDX 2200 from Schlumberger Corp., ATE Division. The tester sends signals to the reference block, and can also measure signals coming from the reference block. An advantage is that the measuring point 116 for signal arrival is at the fixture level, rather than at the loadboard level. This permits the electrical path length between the loadboard and the fixture to be taken into account to more accurately determine when a signal sent from the tester arrives at the reference block (or alternately, when a signal from the reference block arrives at the tester). Although this electrical path length may not be great in absolute terms, it becomes significant when defining the characteristics of high performance integrated circuits. The reference block 110 is fabricated to have (as nearly as possible given manufacturing constraints), the relevant same dimensions as the integrated circuit (DUT) to ultimately be tested while placed in the fixture. Thus, the apparatus allows the tester to measure itself through a device that is as physically identical to the intended DUT as possible.

Figure 2A:
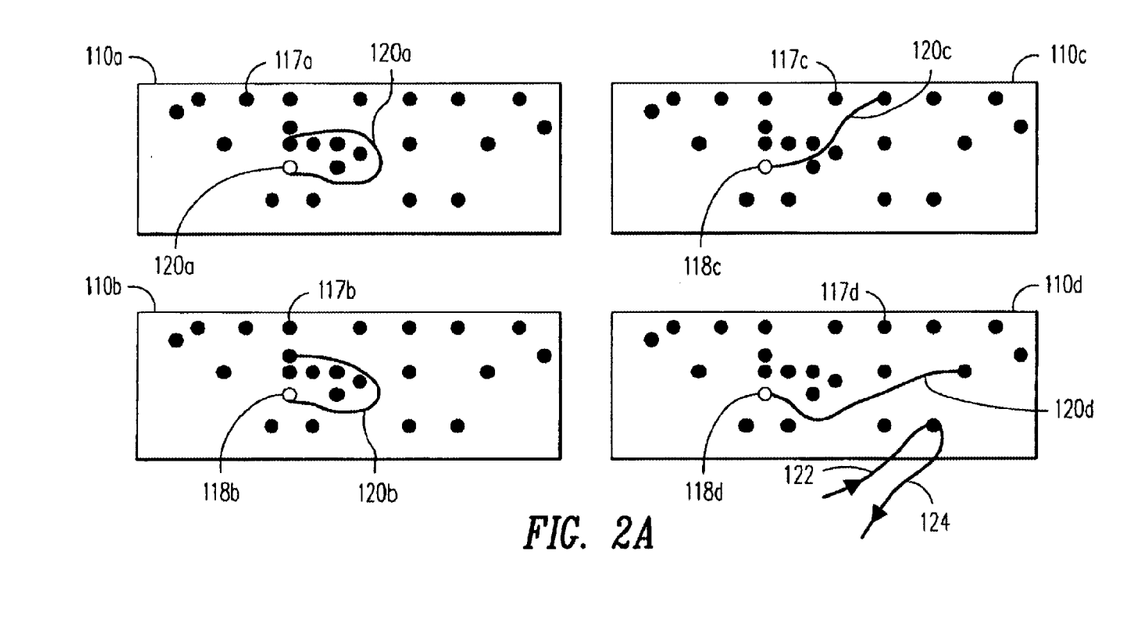
FIG. 2A depicts reference blocks according to the present invention, as viewed from below.

FIG. 2A is a view of a set of reference blocks 110a, 110b, 110c, 110d according to the present invention as seen from below, i.e., as would be seen by the fixture in which each reference block is placed. While four reference blocks 110a, 110b, 110c, 110d are shown, it should be noted that this number is merely for illustrative purposes; the number of reference blocks actually required equals the number of high speed signal terminals on the DUT subject to common timing calibration.

Each of the four reference blocks 110a, 110b, 110c, 110d depicted has several high speed signal terminal locations 117a, 117b, 117c, 117d and a single reference terminal 118a, 118b, 118c, 118d (shown as closed circles and an open circle, respectively, for clarity of presentation only). For each reference block, the reference terminal 118a, 118b, 118c, 118d is in the same location. Each reference block in the set has one or more signal terminals and a reference terminal in the same physical locations as the intended DUT. In one embodiment, two tester channels are coupled to each signal terminal on each reference block. A first tester channel 122 supplies a pulse to the signal terminal (driver), while a second tester channel 124 detects pulses from the signal terminal (comparator) (for clarity of presentation, only one signal terminal is shown as being electrically connected to two tester channels). Such a terminal is called a dual transmission line (DTL) terminal. The reference terminal selected should not itself be a terminal requiring accurate timing calibration, because the reference terminal cannot calibrate itself to the same accuracy as the other terminals. Preferably, the common reference terminal selected should not be a DTL terminal. If a DTL terminal is to be calibrated, both driver and comparator are provided with 50 ohm termination at the ends of their respective transmission lines to eliminate reflections. It is also helpful, but not essential, that the reference terminal selected be centrally located on the reference block, so that signal traces 120a, 120b, 120c, 120d are more easily used. Signal traces 120a, 120b, 120c, 120d are used to electrically connect a unique, single high speed signal terminal on each reference block to the reference terminal on each reference block.

Each signal trace on each reference block should be closely matched both physically and electrically (equivalent for testing purposes) to the signal traces used in the remaining members of the set of reference blocks, so that the electrical path length associated with each signal trace is nearly identical. The length of the signal traces used here is about 10 mm; the variation in length for the entire set of traces is less than 0.5 mm. The impedance of each signal trace in the set is about 50 ohms; the actual resistance of each signal trace is less than 1 ohm. The impedance of the signal trace is determined mostly by the thickness of the associated dielectric layers found on the reference blocks. The reference blocks are in one embodiment made from alternating layers of copper and dielectric material, as on a conventional printed circuit board.

Figure 2B:
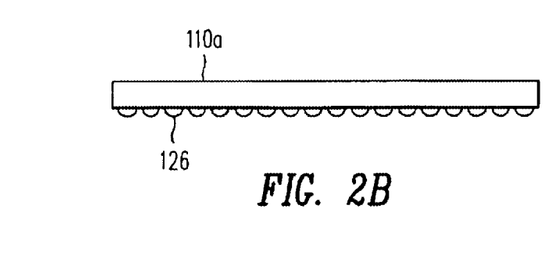
FIG. 2B depicts a reference block according to the present invention, in a side view.

FIG. 2B depicts one of the reference blocks 110a viewed from the side. At the bottom edge of each reference block 110a are contacts 126 for electrical connection between the reference block and the fixture. As stated earlier, the electrical connections on the reference blocks are identical to those on the intended DUT. In one embodiment the electrical connection contacts are solder balls, and so solder balls are depicted here for reference block 110a, but this is not limiting. Other electrical connections may be used.

Figures 3A, 3B, 3C:
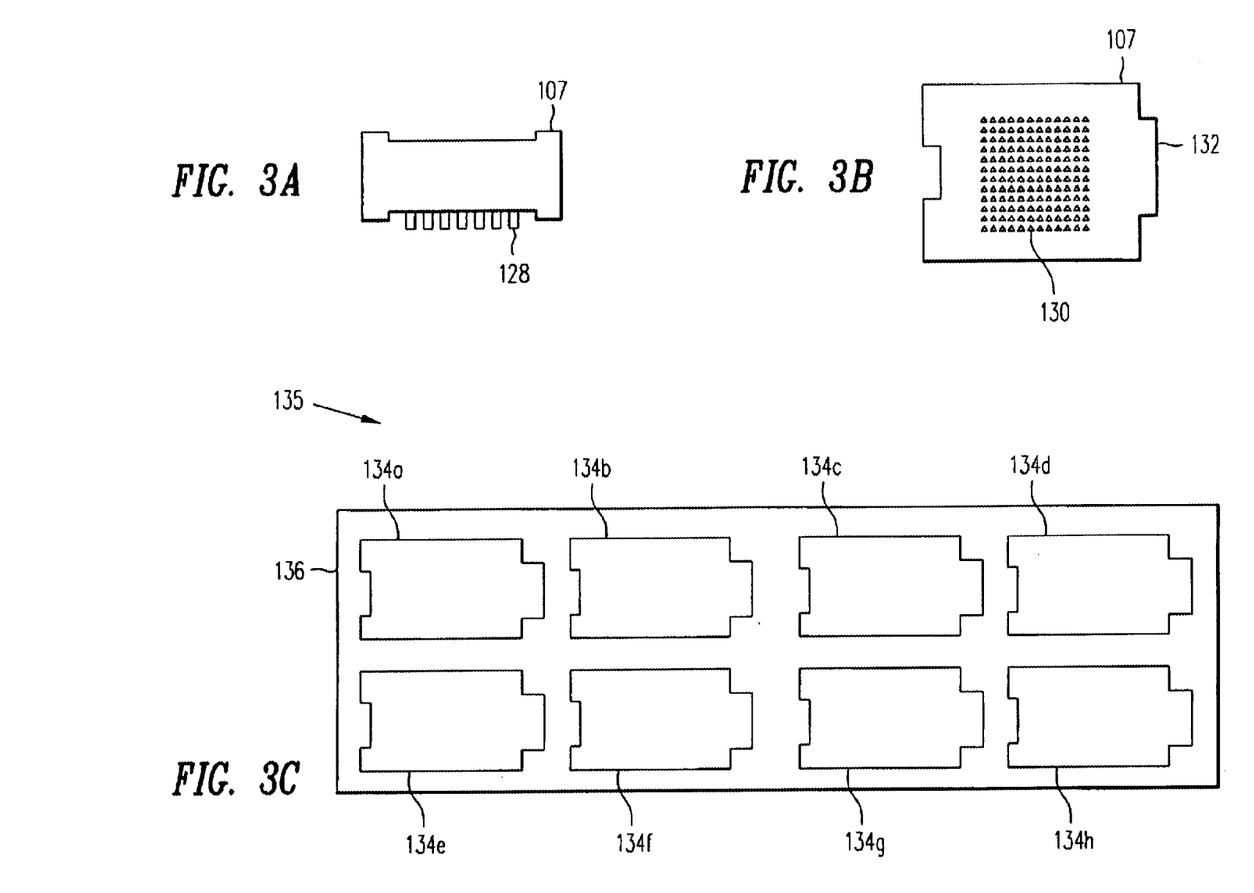
FIGS. 3A and 3B depict two views of a fixture which may be used in practicing the present invention.
FIG. 3C shows a set of reference blocks in a tray.

FIGS. 3A and 3B depict in side view and plan view, respectively, a fixture which may be used in the present invention. Typically, a DUT is placed in such a fixture 107 to electrically connect the DUT to a loadboard (not shown), which in turn permits each individual terminal (pin) on the DUT to be electrically connected to the tester (not shown). The fixture is also known as a "socket" in the ATE field. Here a reference block is first placed in the fixture so that timing calibration of the tester may be performed, before testing of the integrated circuits. The fixture 107 has electrical contacts 128 protruding from the bottom to provide electrical connection to the loadboard, and ultimately the tester via the contact through holes 130. The footprint 132 of the individual fixture is also shown.

Timing calibration of the tester is performed in the following manner. A set of reference blocks is fabricated, the number of reference blocks in the set being equal to the number of signal terminals on the integrated circuit DUT being subject to the timing calibration. One of the reference blocks from the set is inserted into the fixture. As described earlier, each reference block has a signal trace on it which electrically connects its signal terminal to its reference terminal. The tester then programs a pulse on the signal terminal, and measures the amount of time that elapses until the resulting pulse occurs on the reference terminal, which is on the order of 70 picoseconds. Signal flow direction (polarity) is then reversed and the tester programs a pulse on the reference terminal. The tester then measures the amount of time that elapses until the resulting pulse occurs on the signal terminal. These relative timing offset values are saved in the tester memory. These steps are repeated for each reference block in the set. The highest relative offset timing values obtained are used to calibrate the tester timing for both programming a pulse on the signal terminals ("driving") and measuring a pulse on the signal terminals ("comparing"). This may be done in several ways. In one embodiment, the tester has a calibration register and a timing generator. The calibration register adjusts the relative timing offset values to match the highest timing offset value obtained when driving and when comparing. The timing generator then uses these highest timing offset values obtained to adjust the tester timing. A final calibration is performed to equalize the difference between the relative timing offset for programming a pulse on the reference terminal and for measuring a pulse on the reference terminal. The final calibration is discussed in greater detail below. Advantageously, an automatic parts handler could be used to insert and remove the multiple reference blocks into the fixtures. FIG. 3C shows a typical automatic parts handler loading tray with a set of reference blocks ready for use.

Figure 4A:
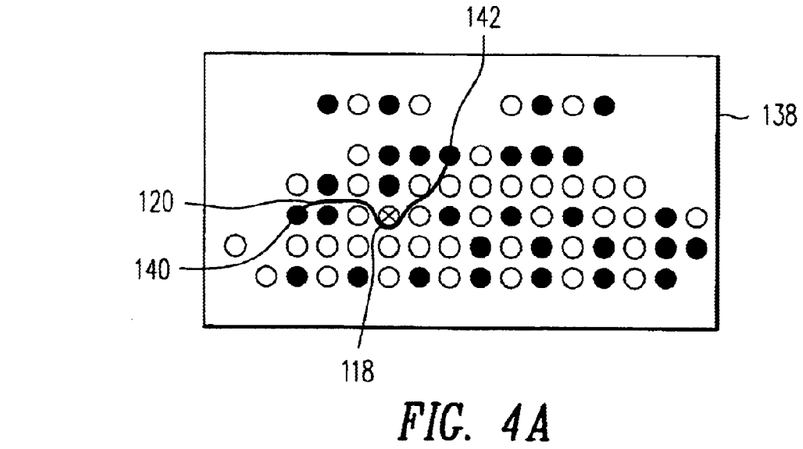
FIG. 4A shows a reference terminal alignment block according to the present invention.

FIG. 4A depicts a reference terminal alignment block 138, as viewed from below. The reference terminal alignment block 138 is an additional reference block used to ensure that the timing offset that occurs while comparing at the reference terminal (programming a pulse on a signal terminal and observing when the resulting pulse is observed at the reference terminal) is made equal to the timing offset that occurs while driving at the reference terminal (programming a pulse on a reference terminal and measuring when the resulting pulse is detected at the same signal terminal). The reference terminal alignment block 138 is different from the others of the set of reference blocks described above in that the signal trace 120 electrically connects two high speed signal terminals, a first high speed signal terminal 140 and a second high speed signal terminal 142, to the common reference terminal 118 (here indicated as a circle with an X marked through it, for clarity of presentation). Any two high speed signal terminals on the reference terminal alignment block may be used for this step, but the reference terminal used must always be the same common reference terminal connected to the signal trace on all of the reference blocks in the set.

Figure 4B:
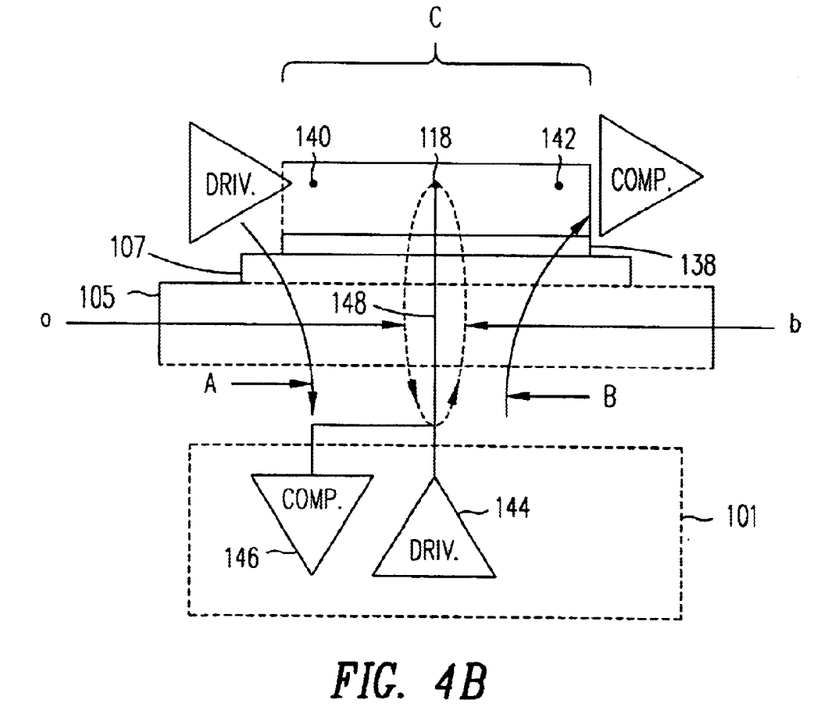
FIG. 4B depicts a side view of the FIG. 4A reference terminal alignment block, while it is in use.

FIG. 4B depicts, in a combined cross-sectional and electrical schematic view, the reference terminal alignment block 138 while it is in use for equalizing time offsets in the final calibration. The several layers of interconnecting circuitry that are typically present between the tester and the DUT are shown with dashed lines in schematic fashion. These include tester 101, loadboard 105 and fixture 107. The tester 101 includes both a driver circuit 144 and a comparator circuit 146. A conductor 148 connects the driver and comparator circuits to the common reference terminal 118 on the reference terminal alignment block 138. The conductor has an electrical path length "a", when the common reference terminal 118 is driving a signal pulse received from first signal terminal 140, which contributes to relative time delay A observed between driving a signal pulse at signal terminal 140 and detection of that signal pulse by the comparator circuit 146; a relative time delay C is also observed between the driving of that same signal pulse at signal terminal 140 and detection of that signal pulse at the comparator circuit 142 after it passes by the common reference terminal 118. Similarly, the conductor has a different electrical path length "b", when the common reference terminal 118 is receiving a signal pulse from the tester 101, that is ultimately measured by the comparator at second signal terminal 142, which contributes to time delay B. By setting electrical path lengths a and b equal to each other, the timing offset that occurs while driving with the common reference terminal is made equal to the timing offset that occurs while comparing with the common reference terminal.

According to transmission line theory,

| | |
|---|---|
| $C=(A-a)+(B-b)$ | [Eqn. 1] |
| Setting a equal to b yields: $C=(A-a)+(B-a)$ | [Eqn. 2] |
| Solving for a yields: $a=(A+B-C)/2$ | [Eqn. 3] |

Assume, for example, that the values of delays A, B, and C were found to equal 200 ps, 300 ps, and 400 ps, respectively. Then the value for a, according to Equation 3, would be:

$$a=(200\text{ ps}+300\text{ ps}-400\text{ ps})/2=50\text{ ps, or }0.050\text{ ns}$$

This electrical path length of 50 ps would then be taken into account in final calibration to adjust the tester timing so that it would fire a signal pulse when it was supposed to. Thus, if signal terminal #1 was instructed to fire a signal pulse at 1 ns, the tester, taking into account electrical path length a, would actually fire the signal pulse 0.05 ns earlier, at 0.95 ns. Similarly, if the tester was instructed to measure (compare) a signal pulse from signal terminal #1 at 1 ns, it would take into account electrical path length "a" and actually measure the signal pulse 0.05 ns later, at 1.05 ns.

As mentioned above, final calibration requires setting electrical path length a equal to electrical path length b. In practice, there are several ways to carry out this final calibration using the reference terminal alignment block. In the first method, measurements of A and B are made on all of the reference blocks in the set, and stored in a timing calibration look-up table in the tester memory. The values of A, B, and C are then measured on the reference terminal alignment block and the value of electrical path length a is calculated, and then used to adjust all the other reference block measurements stored in the timing calibration look-up table. Thereafter, for each timing edge event sent to a signal terminal on a given reference block from the tester, the timing calibration look-up table is consulted and the timing adjusted. In a second method, delays A, B, and C are measured on the reference terminal alignment block first, then a is calculated and used to calibrate the reference terminal (that is, set electrical path lengths a and b equal to each other, after determining the offset between a and b). Then, delays A and B can be measured on the remaining reference blocks in the set and used in the timing calibration look-up table without further adjustment. While both methods yield approximately the same tester timing accuracy, the second method may be slightly more accurate under certain conditions. However, it requires a particular reference block (the reference terminal alignment block) to be used first. This is not always possible with an automatic parts handler and so the first method is usually used with automatic handlers.

The above is similar to the disclosure of the above-referenced copending application Ser. No. 09/514,708.

This approach (as described above in connection with FIGS. 1–4) has been found to have the basic limitation that a DUT with N pins to be calibrated requires at least N unique reference blocks. Hence this is not very useful for calibrating a DUT socket for a DUT having a very large number of pins, such as the, e.g., 600 I/O (input/output) pins of a typical large integrated circuit.

However, it has been found that there is an exception for this limitation on N total pins–N blocks. This reference block technique has also been found to be useful for even large pin count DUTs that have multiple smaller groups of input/output pins with tight internal calibration requirements only amongst the pins in each group. An example of this is a source synchronous DDR (Double Data Rate) bus IC; other examples are source synchronous LVDS (Low Voltage Differential Signaling ICs) or ICs with multiple RAC (Rambus ASIC Cell) channels where RAC is a type of memory bus.

A source synchronous bus is a set of input or output conductors (in this case on an integrated circuit) in which the timing is specified only with respect to an input or an output clock signal that is associated with the bus. ("Bus" generally refers to a grouping of channels carrying I/O signals here.) In this case a bus is a group or bundle of channels each associated with an input/output terminal where the bus has an associated clock signal. The timing relationships to all the other pins of the device under test are specified much more loosely (or not at all). This has been found to dramatically reduce the number of reference blocks required in order to calibrate the tester for testing the entire DUT.

In the DDR case, a memory controller has, for instance, 128 input/output pins segmented into, for instance, 16 groups of 8 data bus (I/O) pins, each group with its own clock signal and clock pin. Thus there are 144 total relevant pins on the DUT, including the clock signal pins. Each group of 8 I/O channels and its accompanying clock signal channel are self contained from a timing point of view. That is, they need to be calibrated for timing purposes only with respect to one another. Hence with as few as 9 insertions of nine different reference blocks, all the critical source synchronous timings for the DUT may also be calibrated. In accordance with this method, for each of the 16 groups of pins, all 9 traces on the set of blocks are the same length on each one of the reference blocks in the set.

Figure 5:
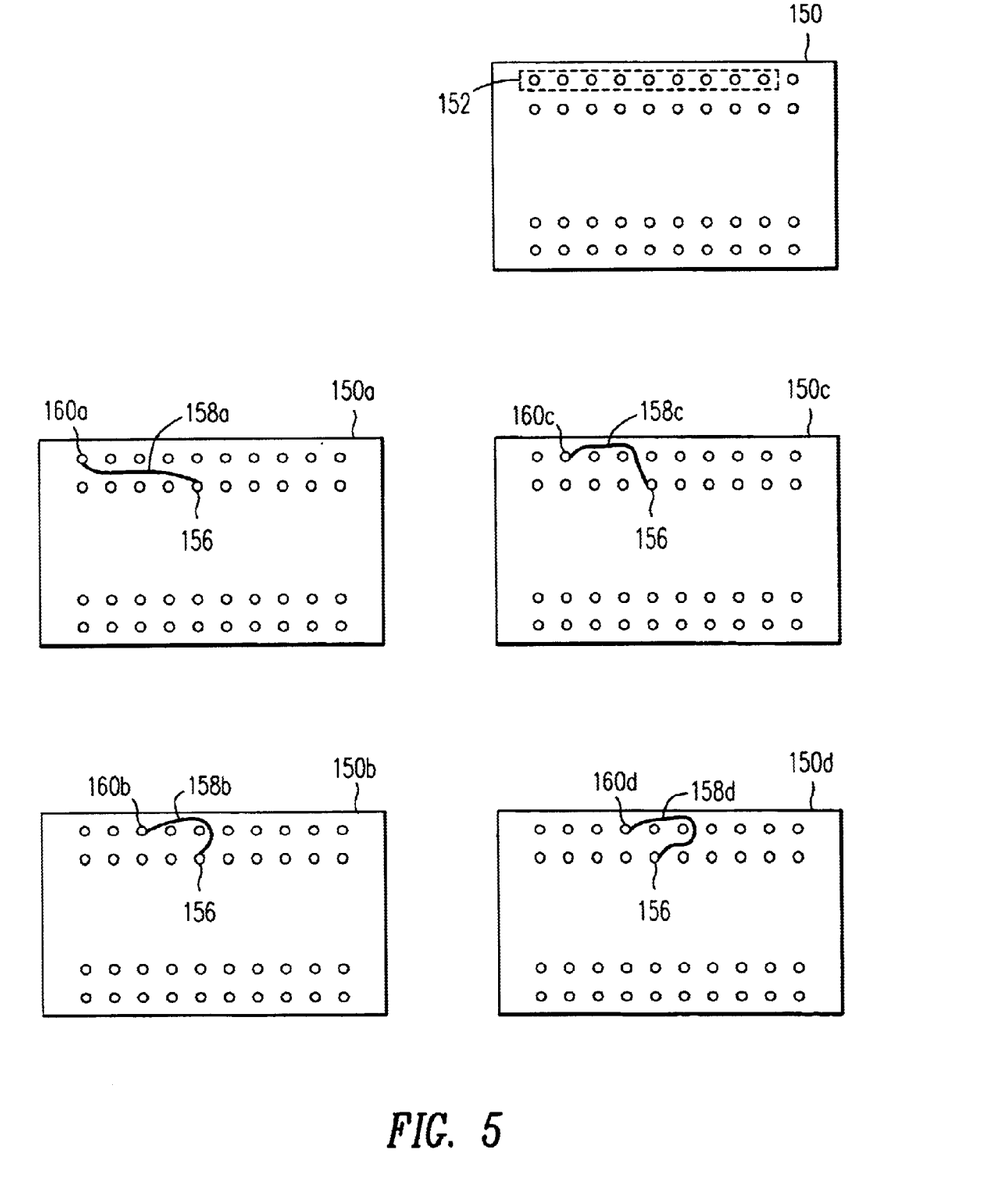
FIG. 5 depicts a reference block set for a group of pins.

FIG. 5 depicts the 9 pins 152 to be calibrated on DUT 150 to a selected probe pin (reference terminal). (Only four rows of pins are shown here on DUT 150, each row with 10 pins, there being also an external ground pin also provided in each row.) The depiction of FIG. 5 is similar to that of FIG. 2A in showing the underside of the reference blocks and is similar to what is described in application Ser. No. 09/514, 708.

The group 152 of 9 pins in the top row includes 8 I/O pins and one clock signal pin. There is provided a set of 9 corresponding reference blocks of which only blocks 154a, 154b, 154c, 154d are shown, each having the same layout as DUT 150. Thus 4 of the total 9 reference blocks in the set are shown. In each block there is a jumper from the selected probe pin to one of the other pins. The remaining (non-depicted) five blocks of the set have similar connections from the selected probe pin to one other of the particular 9 pins to be calibrated in the top row. A selected probe pin 156 on the second row of pins in each block is connected by, respectively, traces 158a, 158b, 158c, 158d to pins 160a, 160b, 160c, 160d of group 152 of each block.

Figure 6:
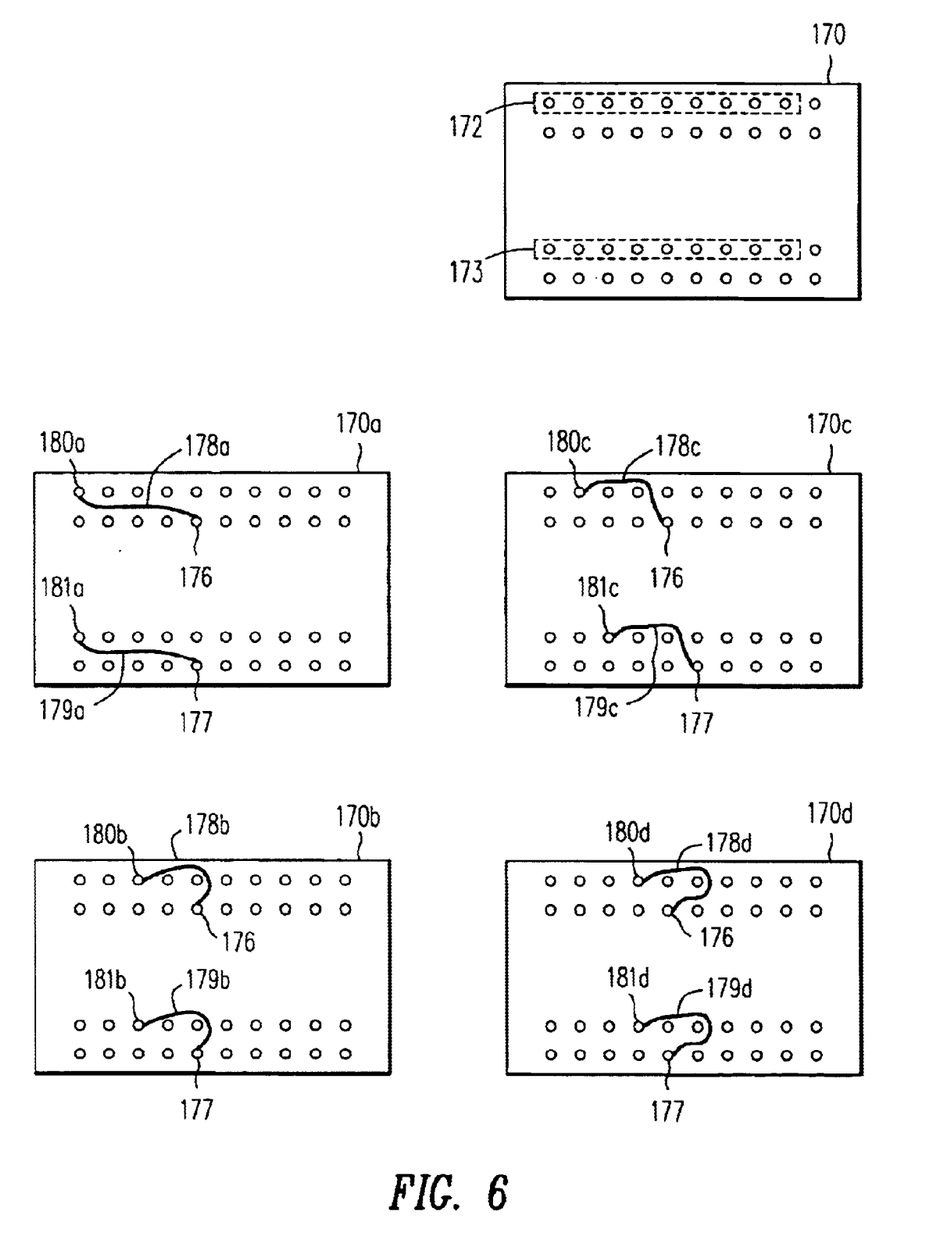
FIG. 6 depicts a reference block set for a group of pins with two internal subgroups.

FIG. 6 shows an improvement and extension of the FIG. 5 method where there is calibration of multiple groups of pins. This allows for example calibration of the 144 pin DDR bus mentioned above with a set of only 9 reference blocks.

In FIG. 6, DUT 170 has two groups of pins 172, 173, each with 9 pins (8 I/O and one clock signal pin). There is a set of 9 associated reference blocks in the set of which only four blocks 170a, ..., 170d are shown. Each reference block has a probe pin 176 in its second row and 177 in its lowest row. Hence each block has two traces connecting each probe pin 176, 177 to each of the pins in groups 172, 173. For instance, block 170a has trace 178a connecting probe pin 176 to pin 180a in group 172, and trace 179a connecting probe pin 177 to pin 181a in group 173. Thereby two paths can be calibrated with a single reference block; this can be extended to 16 or more paths on the same reference block.

In order to carry out the present calibration method, typically one would use the prior art time domain reflectivity calibration in order to calibrate in terms of timing all of the pins relatively close to one another, e.g., ±50 ps to ±100 ps. Then the present reference block technique is used on each group of 9 pins to align them even closer in terms of timing to one another of the members of the group, to obtain the much tighter timing requirements for that group of pins.

Figure 7:
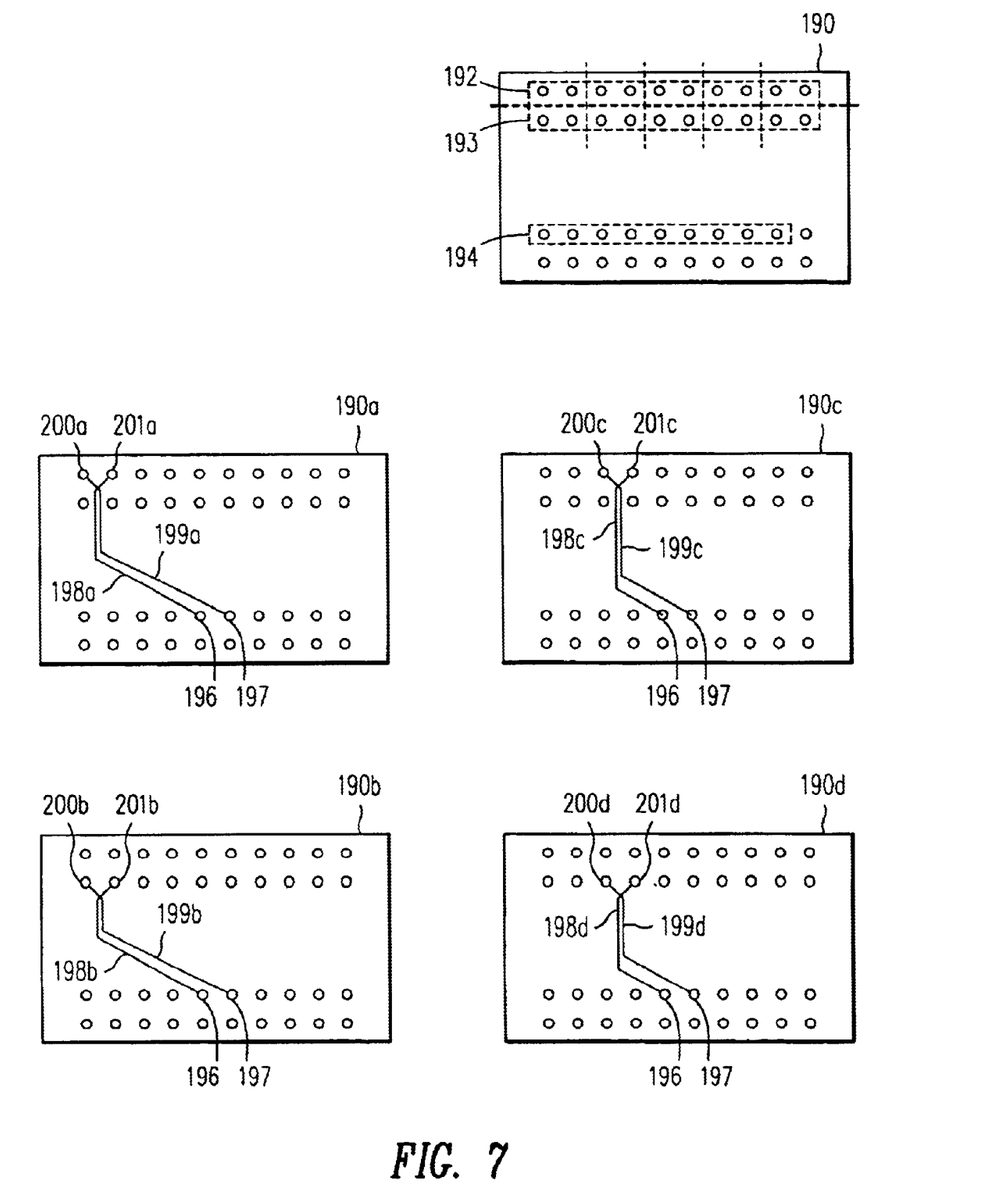
FIG. 7 depicts a reference block set for a DUT having differential signaling.

Another associated method is used to calibrate differential input or output channels such as in the above-mentioned low voltage differential signaling (LVDS) scheme. LVDS is a well known technique using low voltage differential signals with a relatively small voltage swing, for instance, 400 millivolts to 800 millivolts, between the logic high and logic low signals and in each case, an associated complementary signal of the opposite type. The main signal and the complementary signal are typically designated, respectively, "true" and "bar." Hence differential signals require at any one time two signals which switch, ideally, simultaneously. A critical parameter for LVDS is the skew (time delay) between the true and the bar signals when they switch. It has been found to be advantageous to use the reference blocks for tester calibration in this connection as shown in FIG. 7. Here there are two selected probe pins in the lower row. Differential jumpers (paired traces) are present on each reference block. That is, the traces are paired as shown in FIG. 7.

Thus in FIG. 7 DUT 190 has the same pin arrangement as in FIG. 6, except that here the signaling is differential. There are two upper rows of pins 192, 193 and the probe pins are (arbitrarily) selected from the lower row 194. Here the two selected probe pins are pins 196, 197 on each of the four depicted associated reference blocks 190a, ..., 190d. There is one block for each signal in the group to be calibrated, and differential signals require two pins each. For example, on reference block 190a, paired traces 198a, 199a respectively connect probe pins 196, 197 to pins 200a, 201a. Differential signal pins on DUTs are typically adjacent for best differential matches. Hence adjacent probe pins on each reference block are connected by the paired traces to nearby I/O and clock signal pins. Similarly, paired traces are present as shown on each of other depicted reference blocks 190b, 190c, 190d.

This arrangement allows calibration of true/bar signal skew on these groups of terminals. In the example shown in FIG. 7 there are 9 LVDS data (I/O) pins and a differential clock signal pin in each row of pins. In this example, again there would actually be 9 reference blocks in the set of which only 4 are shown in FIG. 7. The other reference blocks in the set would be connected using the same arrangement of differential connections between the upper set and the lower rows of pins.

Figure 8:
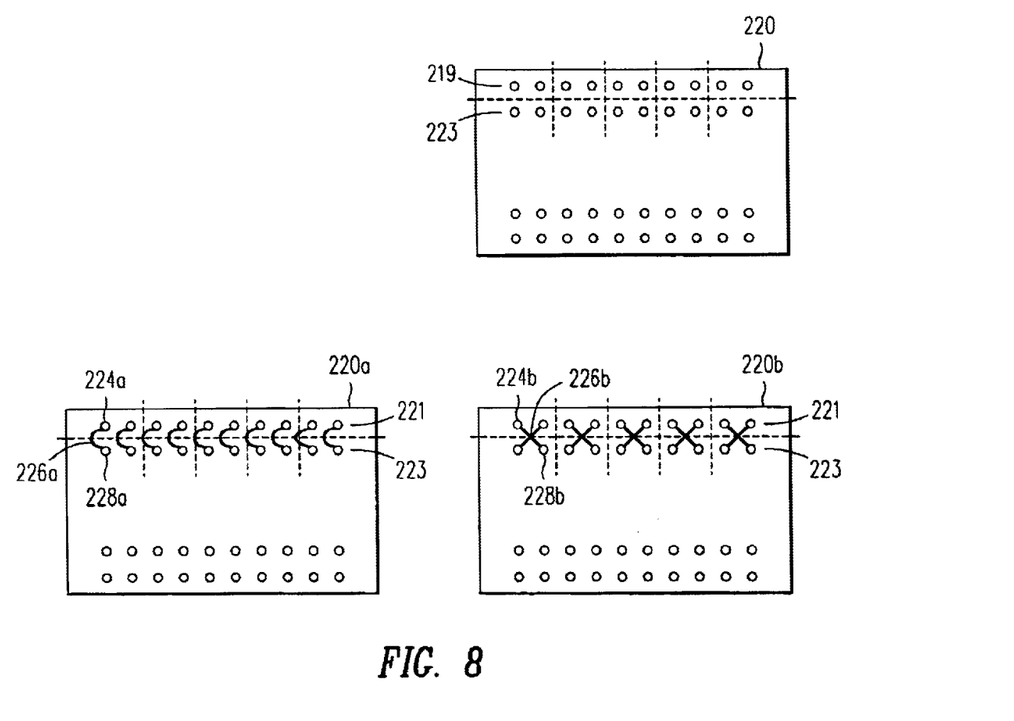
FIG. 8 depicts a reference block set for differential true/bar skew calibration.

FIG. 8 depicts another differential signal calibration between the true and bar (complementary signals) output from a DUT having differential signaling. In this case the tester has the capability to measure a differential signal in a single ended fashion, using separate skew measurements of the true and bar inputs. This capability is present in, e.g., the following types of testers: ITS9000RX, ITS9000ZX, supplied by Schlumberger Technologies, Inc.

FIG. 8 shows a DUT 219 having two upper rows 221, 223 of pins with a differential signaling scheme. The associated reference block set here has just two blocks 220a, 220b with traces connecting each pin in row 221 with a nearby pin in row 223. For example, on block 220a pin 224a in row 221 is connected by trace 226a to pin 228a in row 223. On block 220b, a cross-trace arrangement is used with pin 224b in row 221 connected by trace 226b to pin 228b in row 223. Thereby two blocks 220a, 220b make up the set. The objective is to determine (and calibrate) the offset between the true and bar signals in each differential pair of pins. For this purpose, the differential pin pairs are separated into groups of two (for four pins total). The two pairs do not need to be related in terms of signaling. Two reference blocks 220a, 220b are then fabricated as shown in FIG. 8. All four traces for each group of four pins must be matched in length. The trace lengths can be different for another group of four pins if needed. Now, any of the four pins in the group can be a "probe pin" for the two pins in the opposite pair and can be aligned (calibrated) together.

Note that other trace arrangements are possible as long as all traces in a set of blocks are of the same length. Each row 221, 223 is divided up into columns of pins, as shown by the broken lines, so that the set of four pins defines one signaling channel. Thus by using a reference block set as shown in FIG. 8 that has two blocks and that connects adjacent differential pairs normally and then inverted, the switching skew between all the compared channels can be measured and calibrated, leading to very accurate measurements of differential skew. The tester must be able to drive signals on at least one of the pairs and must be able to compare on at least one of the pairs. If the tester has dedicated input differential pairs and dedicated output differential pairs, they should be grouped together, one input pair to one output pair. Each "true" and "bar" comparator in the tester can observe a common driver probe pin which is the true drive output of the adjacent pin. Hence the relative skew can be calibrated with only two block insertions for all the differential signal pins in the DUT.

The following discloses construction improvements for the reference blocks. Preferably the traces on the reference blocks are kept short, but of matched length in each set, and are all on the same conductive layer of each block. The object is to reduce alternating current loss and reduce voltage variation. It has been found best if the reference blocks are constructed using a minimum number of conductive layers and having a good ground plane. One example of block fabrication uses standard printed circuit board (PCB) material manufactured to the specified DUT package thickness with all of the trace connectors in a single large PCB panel. This panel is then cut up to the exact size of each block using a laser or diamond saw. Ball grid array solder balls can be mounted directly on the printed circuit board material if needed for connecting the traces as long as the appropriate trace pads are present, as formed on the printed circuit board using the conventional copper conductive material.

It has been found advantageous in some embodiments to provide reference blocks with a simulated lid to match the lid on the actual DUT so that the reference blocks fit properly in the autohandler and DUT socket. A piece of machined printed circuit board material or appropriate electrostatic charge safe plastic is typically adhered in place as the lid. Also, preferably the reference blocks each have a weight similar to that of the DUT so they are properly handled by the autohandler. The surfaces of the reference blocks to be picked up by the autohandler should emulate the surface of an actual DUT in terms of smoothness.

It is has also been found that the selection of the common probe pin (also referred to as a reference pin) is significant. The common probe pin must be on a channel which has as high a bandwidth as possible and should be physically as close as possible to the entire group of pins being tested that it is used to calibrate. If the group of pins to be calibrated includes a bidirectional input/output pin then the probe pin should also be a bidirectional input/output pin. (Some DUT and/or tester pins can only be input or output pins and so are not bidirectional.)

Other relevant factors include the compared bandwidth of the channel in the tester to which the probe pin is connected.

This is a limiting factor in terms of calibration. If the bandwidth of the FIG. 4B comparator is near the driver of FIG. 4B, then it is even more important to have a similar trace signal loss in each of the pins in each group.

Another consideration is if particular DUT pins are so-called "flyby" pins. Flyby refers to a pin which uses two transmission lines to the DUT, one for input signals and one for output signals. Such flyby pins typically represent two standard loads to the reference block terminal. This results in additional signal attenuation so the comparator of FIG. 4B and the remainder of the tester need to work well at low signal amplitude. Also the presence of the flyby pin causes additional reflections of signals going back to the FIG. 4B driver. Elimination of this reflection is typically obtained by well matched load board (load board 105 in FIG. 1), trace driver and comparator terminations.

It has also been found useful to have low DUT socket contact resistance to the reference block for good calibration. The tester apparatus should check contact resistance before doing a timing measurement.

The tester apparatus also needs to use its contact resistance test to identify the reference block currently in the socket, make the appropriate measurements and store the results. At the end of a calibration run on a particular set of reference blocks the tester apparatus (and the controlling associated computer program) checks to make sure that the complete reference block set was tested and then computes the final calibration values. For parallel test systems with multiple sockets for DUTs which are all tested in parallel the reference blocks may need to pass through the autohandler in a specific order or multiple times in order to make sure that at least one of each block in the set was measured in each socket.

This disclosure is illustrative and not limiting; further modifications will be apparent to those skilled in the art in light of this disclosure and are intended to fall within the scope of the appended claims.

We claim:

1. A method of calibrating integrated circuit tester timing, comprising the acts of:
   providing a fixture for electrical connection to a tester of an integrated circuit to be tested, the fixture having electrical connections to one or more signal terminals and a reference terminal of the integrated circuit, the signal terminals being associated in a plurality of groups, each group having a common timing requirement;
   providing a set of reference blocks, a number of said reference blocks in the set being equal to a number of signal terminals in each group on the integrated circuit, the reference blocks each being adapted for insertion into said fixture, and further having one or more signal terminals and a reference terminal in the same relative locations as does the integrated circuit, and further having electrical connections to make electrical contact with the electrical connections of the fixture in the same location as does the integrated circuit;
   inserting a selected one of the reference blocks into the fixture, the selected reference block having disposed thereon a signal trace, the signal trace electrically connecting a single signal terminal in each group requiring calibration on the reference block to a reference terminal on the reference block;
   programming a pulse on the signal terminal of the reference block to be calibrated; and
   measuring a first amount of time that elapses until a resulting pulse occurs on the reference terminal.

2. The method of claim 1, further comprising:
   programming a pulse on the reference terminal of the reference block; and
   measuring a second amount of time that elapses until a resulting pulse occurs on the signal terminal of the reference block to be calibrated.

3. The method of claim 2, further comprising:
   repeating the acts of inserting a selected one of the reference blocks, programming a pulse on the signal terminal, measuring a first amount of time, programming a pulse on the reference terminal, and measuring second amount of time for each reference block in the set;
   determining a relative timing offset of each signal terminal from the act of measuring a first amount of time and measuring a second amount of time;
   adjusting the relative timing offset values obtained in the act of determining the relative timing offset so that they match the highest relative timing offset value obtained; and
   performing a calibration wherein the timing offsets for programming a pulse on the reference terminal and for measuring a pulse on the reference terminal are equalized.

4. The method of claim 1, further comprising the act of inserting the reference blocks into the fixture using an automated handler.

5. The method of claim 1, further comprising the act of coupling two tester channels to each signal terminal on the reference block, there being a first tester channel supplying the pulse to the signal terminal, and a second tester channel detecting the pulse from the signal terminal.

6. The method of claim 1, in which the signal trace has an impedance of about 50 ohms, and a length of about 10 mm.

7. The method of claim 1, in which the act of performing the calibration is performed using an additional reference block, the additional reference block having disposed thereon a signal trace electrically connecting said reference terminal of the additional reference block to a first signal terminal of the additional reference block and to a second signal terminal of the additional reference block.

8. The method of claim 7, further comprising the acts of:
   inserting the additional reference block into the fixture;
   programming a pulse on the first signal terminal, and measuring when the resulting pulse from the programmed pulse occurs at said tester and said reference terminal;
   programming a pulse on the tester, and measuring when the resulting pulse from the programmed pulse occurs at the reference terminal and the second signal terminal.

9. The method of claim 1, wherein the integrated circuit to be tested is a source synchronous integrated circuit, and each group has an associated clock signal.

10. The method of claim 1, wherein the integrated circuit employs differential signaling on the one or more signal terminals, and the signal traces on the reference block are disposed in pairs.

11. The method of claim 10, wherein the one or two reference block on which the signal traces connect adjacent differential pairs of the signal terminals.

12. An apparatus comprising: a set of reference blocks each adapted for insertion into a fixture which electrically connects an integrate circuit to be tested to a tester, a number of the reference blocks in the set being equal to a number of signal terminals being subject to testing on the integrated circuit, the signal terminals being associated in a plurality of groups, each group having a common timing requirement and wherein a number of the reference blocks is equal to a number of signal terminals in each group, each reference block having one or more signal terminals and a reference terminal in the same relative locations as does the integrated circuit, and further having electrical connections to make contact with the fixture in the same locations as does the integrated circuit.

13. The set of reference block according to claim 12, wherein each reference block comprises:
  a signal trace electrically connecting a single signal terminal in each group requiring calibration on the reference block to a reference terminal on the reference block.

14. The set of reference blocks according to of claim 12, wherein the signal trace has an impedance of about 50 ohms, and a length of about 10 mm.

15. The set of reference blocks according to claim 12, further comprising an additional reference block having a signal trace electrically connecting said reference terminal of the additional reference block to a first signal terminal of the additional reference block and to a second signal terminal of the additional reference block.

16. A system comprising:
  a fixture which electrically connects an integrated circuit to be tested to a tester; and
  a set of reference blocks each adapted to be inserted into the fixture, a number of the reference block in the set being equal to a number of signal terminals being subject to testing on the integrated circuit, the signal terminals being associated in a plurality of groups, each group having a common timing requirement and wherein a number of the reference blocks is equal to a number of signal terminals in each group, each reference block having one or more signal terminals and a reference terminal in the same relative locations as does the integrated circuit, and further having electrical connections to make electrical contact with the fixture in the same locations as does the integrated circuit.

17. The combination of claim 16, wherein the reference blocks are adapted to be inserted into the fixture using an automated handler.

18. The combination of claim 16, wherein each reference block comprises:
  a signal trace electrically connecting a single signal terminal in each group requiring calibration on the reference block to a reference terminal on the reference block.

19. The combination of claim 16, wherein the signal trace has an impedance of about 50 ohms, and a length of about 10 mm.

20. The combination of claim 16, further comprising an additional reference block having a signal trace electrically connecting said reference terminal of the additional reference block to a first signal terminal of the additional reference block and to a second signal terminal of the additional reference block.

* * * * *